United States Patent [19]

Gheewala et al.

[11] Patent Number: 5,436,801
[45] Date of Patent: Jul. 25, 1995

[54] METHOD AND STRUCTURE FOR ROUTING POWER FOR OPTIMUM CELL UTILIZATION WITH TWO AND THREE LEVEL METAL IN A PARTIALLY PREDESIGNED INTEGRATED CIRCUIT

[75] Inventors: Tushar Gheewala, Los Altos; Rustam Mehta, Sunnyvale; Timothy Saxe, Los Altos, all of Calif.

[73] Assignee: CrossCheck Technology, Inc., San Jose, Calif.

[21] Appl. No.: 120,148

[22] Filed: Sep. 9, 1993

[51] Int. Cl.$^6$ ............................................. H01R 9/00
[52] U.S. Cl. ................................... 361/775; 361/792; 361/803; 174/261; 257/700
[58] Field of Search .............. 361/738, 748, 775, 792, 361/777, 778, 799, 803, 809, 811; 174/255, 261, 260, 254, 257; 257/678, 684, 723, 700

[56] References Cited

U.S. PATENT DOCUMENTS

| | | | |
|---|---|---|---|
| 4,656,732 | 4/1987 | Teng et al. | 29/591 |
| 4,811,237 | 3/1989 | Putatunda et al. | 364/491 |
| 4,824,803 | 4/1989 | Us et al. | 437/192 |
| 5,272,600 | 12/1993 | Carey | 361/792 |

*Primary Examiner*—Leo P. Picard
*Assistant Examiner*—Young Whang

*Attorney, Agent, or Firm*—Townsend and Townsend Khourie and Crew

[57] ABSTRACT

An integrated circuit structure which employs at least two metal levels overlying an array of circuit elements. Each metal level contains signal routing resources which can be used for supplying power and interconnecting circuit elements. The metal levels include a first metal level directly overlying the array of circuit elements, intermediate metal levels (if there are more than two metal levels), and a top metal level overlying all other metal levels. Power carrying tracks are disposed in the top metal level. Power antennae are disposed in the first metal level, but only where necessary to provide power to the circuit elements. The power antennae are for connecting the power carrying tracks to the circuit elements. Power bridges are disposed in intermediate metal levels between the first metal level and the top metal level. The power bridges are for connecting the power carrying tracks to the power antennae. Contacts to the first metal level are used as a means by which the power antennae are connected to the circuit elements. Vias to the metal levels overlying the first metal level are used as a means by which the power carrying tracks are connected to the power bridges and the power antennae, and by which the power bridges are connected to other power bridges and the power antennae.

10 Claims, 3 Drawing Sheets

METHOD AND STRUCTURE FOR ROUTING POWER FOR OPTIMUM CELL UTILIZATION WITH TWO AND THREE LEVEL METAL IN A PARTIALLY PREDESIGNED INTEGRATED CIRCUIT

BACKGROUND OF THE INVENTION

This invention relates to techniques and structures for providing power routing in partially predesigned integrated circuits, particularly integrated circuits known as gate arrays, wherein the utilization of area, such as macro cells per unit area, is optimized.

The design of integrated circuits has become increasingly automated. To facilitate automation, integrated circuit designers have employed increasingly structured design methods which make use of basic circuit building blocks known as macro cells. In addition to the goal of automation, there has also been a desire to achieve greater signal processing capability in ever decreasing physical areas. One of the limiting factors in achieving higher density in integrated circuit design is the actual physical size of the basic circuit building block (i.e., the macro cell). The size of a macro cell is dependent upon, among other things, the area required for interconnecting the macro cell's internal circuit elements (i.e., macro cell transistors) to implement a particular logic function. This is, in turn, dependent upon the manner in which power is distributed within the macro cell.

In the past, the standard design technique with a double level metal architecture (i.e., an IC structure with two metal levels, M1 and M2, for transverse routing) was to provide power routing by means of an M2 and M1 grid. Connections internal to a macro cell were provided on the first metal level, M1. Power buses which distribute power within a macro cell were also provided on M1. FIGS. 1 and 2 illustrate a double level metal (DLM) integrated circuit 10 designed in accordance with prior art techniques. FIG. 1 shows a portion of the integrated circuit 10. Macro cells 12 are arranged in regions called cell channels 14 and are interconnected by computer aided layout software. Interconnection is achieved by overlaying the macro cells with multiple metal levels containing signal routing resources. Horizontal tracks 16 are disposed on the first metal level, M1, and vertical tracks 18 on the second metal level, M2. Traditionally, metal tracks on adjacent metal levels are disposed transversely with respect to each other. Additionally, metal tracks on metal level M1 intended for interconnecting macro cells are usually located in routing channels 20.

FIG. 2 is a top view of a portion of a macro cell 12 showing the manner in which power is supplied to macro cell transistors 22 according to the prior art. A series of power buses 24 is disposed in the first metal level, M1, and connected to power carrying tracks 26 and 28 which are provided on the second metal level, M2. Contacts between a power bus 24 and particular macro cell transistors 22 are made where necessary to supply the transistor 22 with power. Depending upon the particular designer's needs, many transistors 22 may not have such contacts. Nevertheless, the power buses 24 extend across the entire macro cell 12.

Power buses in gate arrays typically require multiple parallel signal paths in order to handle greater currents and minimize resistive losses. As a result, considerable signal routing resources are used by the power buses, restricting interconnection routing on the M1 level. More importantly with respect to the present invention, interconnection of circuit elements on M1 is further restricted because the power buses extend the entire width of the macro cell, thus blocking desired M1 connections between circuit elements within a macro cell on opposite sides of a power bus.

The addition of a third level of metal, M3, increases the availability of tracks for the interconnection of circuit elements. The use of M3 can result in greater M2 interconnect capability due to the greater amount of resources, but does not reduce the interconnection problems of M1 because the use of M3 resources for internal macro cell interconnections is impracticable. This is because the macro cell interconnections are so tightly congested that the area required for the vias necessary for the use of M3 traces could not be accommodated. Thus there is a need for power routing techniques and structures in integrated circuits wherein the number of macro cell transistor connections per unit area is optimized.

SUMMARY OF THE INVENTION

According to the invention, an integrated circuit structure is devised which employs at least two metal levels overlying an array of circuit elements. Each metal level contains signal routing resources which can be used for supplying power and interconnecting circuit elements. The metal levels comprise a first metal level directly overlying the array of circuit elements, intermediate metal levels (if there are more than two metal levels), and a top metal level overlying all other metal levels. Power carrying tracks are disposed in the top metal level. Power antennae are disposed in the first metal level, but only where necessary to provide power to the circuit elements. The power antennae are for connecting the power carrying tracks to the circuit elements. Power bridges are disposed in intermediate metal levels between the first metal level and the top metal level. The power bridges are for connecting the power carrying tracks to the power antennae. Contacts to the first metal level are used as a means by which the power antennae are connected to the circuit elements. Vias to the metal levels overlying the first metal level are used as a means by which the power carrying tracks are connected to the power bridges and the power antennae, and by which the power bridges are connected to other power bridges and the power antennae.

The use of power antennae on the first metal level eliminates the waste of routing resources inherent in the use of power buses according to the prior art. By using short segments on M1 to connect only to macro cell transistors which require power, significant routing resources are conserved. Additionally, interconnection of macro cell transistors using only M1 resources becomes much easier. If the direction of signal paths on M1 is not limited by the blockage of an M1 power bus to one of two orthogonal directions (as in the prior art), the opportunities to interconnect transistors within a macro cell are increased dramatically. Increasing the possible interconnections of macro cell transistors leads to a decrease in the area required to implement a particular circuit design, and therefore to higher circuit density.

It is important to note that the use of Applicant's invention is not confined to automated integrated circuit design. The method may be employed to achieve higher gate densities in any integrated circuit which employs predesigned elements laid out to be interconnected in an array. Furthermore, the routing of power carrying tracks exclusively in the top metal level is merely one embodiment of the invention. As long as the goal of optimum cell utilization is achieved, power tracks may be routed on other metal levels.

A further understanding of the nature and advantages of the present invention may be realized by reference to the remaining portions of the specification and the drawings.

2 is an illustration of the routing of power within a macro cell according to the prior art.

Figure 3:
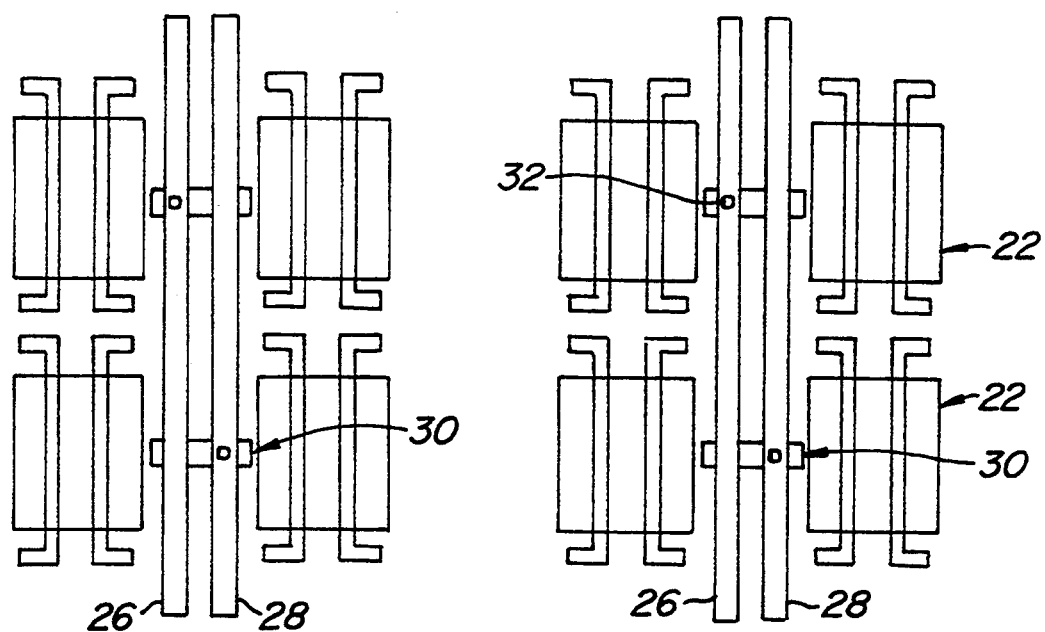

FIG. 3 is an illustration of the routing of power in a double level metal structure according to the present invention.

Figure 4:
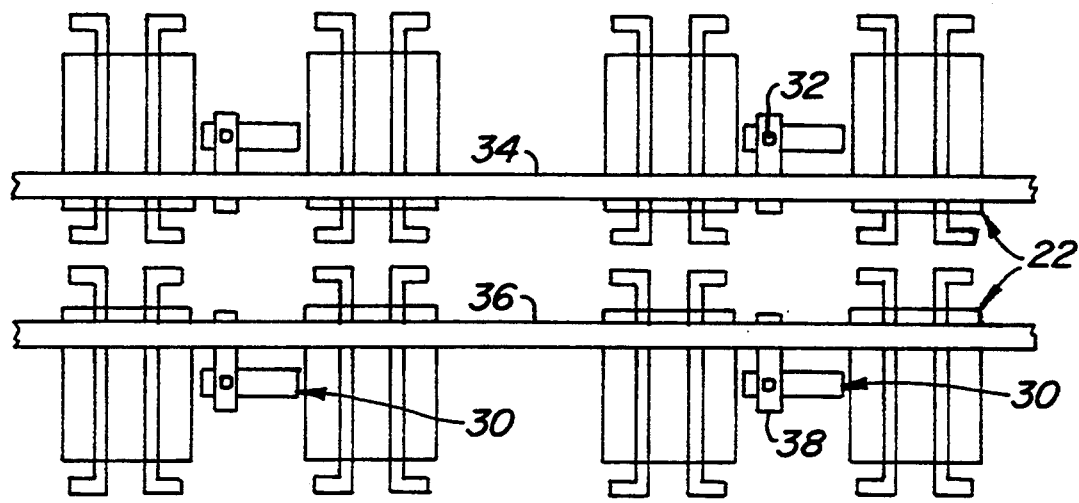

FIG. 4 is an illustration of the routing of power in a triple level metal structure according to the present invention.

DESCRIPTION OF THE SPECIFIC EMBODIMENTS

In one embodiment of the present invention, power routing is provided in an integrated circuit design employing a double level metal (DLM) structure. As with the standard design technique described above, the internal connections of the macro cells are preferably routed on M1. However, unlike the standard technique, power is not distributed by means of power buses on M1. Instead, short segment power antennae connect macro cell transistors with power carrying tracks on M2, thus freeing up signal routing resources on M1.

FIG. 3 is an illustration of a specific DLM embodiment. A portion of a macro cell 12 is shown in a highly stylized manner. Two signal tracks 26 and 28 in M2 are designated as power carrying tracks, $V_{dd}$ and $V_{ss}$ respectively. Each power carrying track is connected to power antennae 30 in the M1 level by means of vias 32. The power antennae 30 are, in turn, connected to individual macro cell transistors 22 by means of contacts (not shown). The power antennae 30 are employed only where necessary to supply power to particular transistors.

Figure 1:
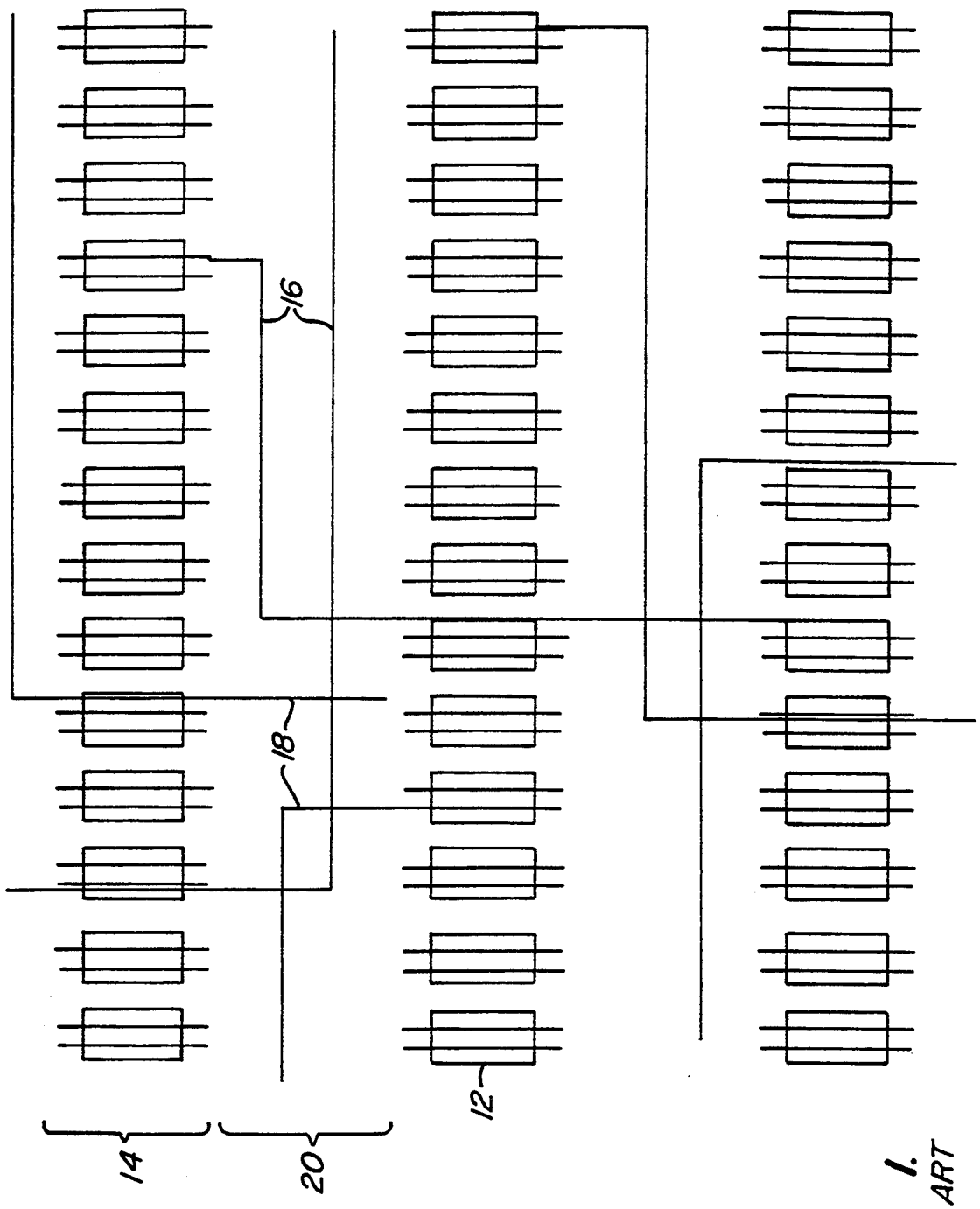
FIG. 1 is an illustration of the interconnection of macro cell according to the prior art.
Figure 2:
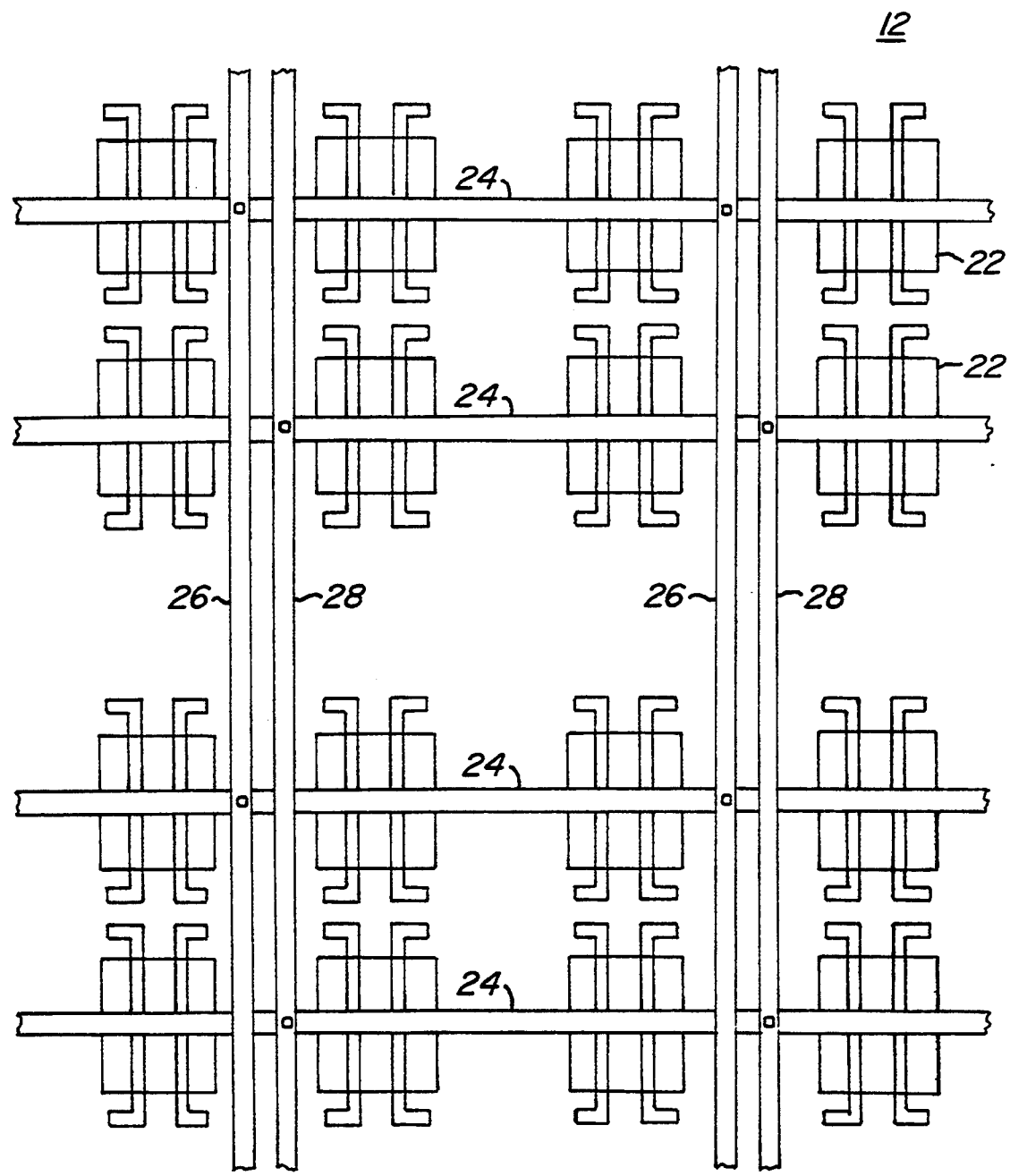

The conservation of signal routing resources achieved by the present invention becomes apparent when FIGS. 2 and 3 are compared. Additionally, the circuit designer is afforded increased flexibility in terms of interconnecting macro cell transistors 22 because signal paths on M1 in the vertical direction are no longer blocked by the horizontal power buses 24. What may not be as readily apparent from FIGS. 2 and 3 is the possibly more important fact that the present invention also results in an increase in the flexibility of macro cell interconnection. Macro cell interconnection resources are augmented because the barriers presented by the power buses have been eliminated. This increased flexibility further contributes to the goal of area optimization.

In another embodiment, power routing is provided in a triple level metal (TLM) integrated circuit. FIG. 4 illustrates a routing scheme for a specific TLM structure. In this embodiment, the internal connections of the macro cells 12 are again routed on M1. However, the routing of power carrying tracks 34 and 36 ($V_{dd}$ and $V_{ss}$) is provided on M3. Power antennae 30 are again provided on M1 where necessary to provide power to the macro cell transistors 22. It is important to note that even though, in this example, $V_{dd}$ and $V_{ss}$ are orthogonal to their counterparts in the above described DLM embodiment, the locations of the power antennae 30 for connecting the power carrying tracks 34 and 36 to the individual macro cell transistors 22 are the same, thus allowing for the same macro cell configuration to be used regardless of whether the structure has two, three, or an arbitrary number of metal levels. To make this possible, power bridges 38 on M2 connect the power carrying tracks 34 and 36 on M3 with the power antennae 30 on M1.

The preceding descriptions of the preferred embodiments should not in any way limit the scope of the invention. The embodiments described are merely some of the possible implementations of the invention. Accordingly, the scope of the invention should be determined solely with respect to the following claims.

What is claimed is:

1. An integrated circuit structure comprising:
   an array of circuit elements;
   at least two metal levels overlying said array of circuit elements, said metal levels comprising a first metal level directly overlying said array of circuit elements, and a top metal level overlying all other metal levels;
   a plurality of power buses disposed only in said top metal level;
   a plurality of discontinuous power antenna segments disposed in said first metal level at first locations to provide power to selected circuit elements, said power antenna segments for coupling said power buses to said selected circuit elements, said first location for each power antenna segment corresponding to a particular circuit element;
   a plurality of discontinuous power bridge segments disposed at second locations in metal levels between said first metal level and said top metal level, said power bridge segments for coupling said power buses to said power antenna segments, said second location for each power bridge segment corresponding to a particular power antenna segment;
   a plurality of contacts to said first metal level by which said power antenna segments are coupled to said circuit elements; and
   a plurality of vias to metal levels overlying said first metal level by which said power buses are coupled to said power bridge segments and said power antenna segments, and by which said power bridge segments are coupled to other power bridge segments and said power antenna segments.

2. An integrated circuit structure as described in claim 1 wherein the number of metal levels is two.

3. An integrated circuit structure as described in claim 1 wherein the number of metal levels is three.

4. An integrated circuit structure comprising:
   an array of circuit elements;
   two metal levels overlying said array of circuit elements, said metal levels comprising a first metal level directly overlying said array of circuit elements, and a second metal level directly overlying said first metal level;
   a plurality of power buses disposed only in said second metal level;
   a plurality of discontinuous power antenna segments disposed in said first metal level at first locations to provide power to selected circuit elements, said power antenna segments for coupling said power buses to said selected circuit elements, said first location for each power antenna segment corresponding to a particular circuit element;

a plurality of contacts to said first metal level by which said power antenna segments are coupled to said circuit elements; and a plurality of vias to said second metal level by which said power buses are coupled to said power antenna segments.

5. An integrated circuit structure comprising:
an array of circuit elements;
three metal levels overlying said array of circuit elements, said metal levels comprising a first metal level directly overlying said array of circuit elements, a second metal level directly overlying said first metal level, and a third metal level directly overlying said second metal level;
a plurality of power buses disposed only in said third metal level;
a plurality of discontinuous power antenna segments disposed at first locations in said first metal level to provide power to selected circuit elements, said power antenna segments for coupling said power buses to said selected circuit elements, said first location for each power antenna segment corresponding to a particular circuit element;
a plurality of discontinuous power bridge segments disposed at second locations in said second metal level for coupling said power buses to said power antenna segments, said second location for each power bridge segment corresponding to a particular power antenna segment;
a plurality of contacts to said first metal level by which said power antenna segments are coupled to said circuit elements; and
a plurality of vias to said second metal level and said third metal level by which said power buses are coupled to said power bridge segments, and by which said power bridge segments are coupled to said power antenna segments.

6. A method of routing power in an integrated circuit, said integrated circuit having an array of circuit elements, and at least two metal levels overlying said array of circuit elements, said metal levels comprising a first metal level directly overlying said array of circuit elements, and a top metal level overlying all other metal levels, said method comprising the steps of:
forming contacts to said first metal level over selected circuit elements where necessary to provide power to the circuit elements;
forming discontinuous power antenna segments at first locations in said first metal level, said power antenna segments for connecting to said contacts, said first location for each power antenna segment corresponding to a particular contact;
forming first vias to intermediate metal levels between said first metal level and said top metal level;
forming discontinuous power bridge segments at second locations in said intermediate levels, said power bridge segments for connecting to other power bridge segments and said power antenna segments by means of said first vias, said second location for each power bridge segment corresponding to a particular power antenna segment;
forming second vias to said top metal level; and
forming power buses only in said top metal level, said power buses for connecting to said power bridge segments and said power antenna segments by means of said second vias.

7. A method of routing power in an integrated circuit as described in claim 6 wherein the number of metal levels is two.

8. A method of routing power in an integrated circuit as described in claim 6 wherein the number of metal levels is three.

9. A method of routing power in an integrated circuit, said integrated circuit having an array of circuit elements, and two metal levels overlying said array of circuit elements, said metal levels comprising a first metal level directly overlying said array of circuit elements, and a second metal level directly overlying said first metal level, said method comprising the steps of:
forming contacts to said first metal level over selected circuit elements where necessary to provide power to the circuit elements;
forming discontinuous power antenna segments at first locations in said first metal level, said power antenna segments for connecting to said contacts, said first location for each power antenna segment corresponding to a particular contact;
forming vias to said second metal level; and
forming power buses in said second metal level for connecting to said power antenna segments by means of said vias.

10. A method of routing power in an integrated circuit, said integrated circuit having an array of circuit elements, and three metal levels overlying said array of circuit elements, said metal levels comprising a first metal level directly overlying said array of circuit elements, a second metal level directly overlying said first metal level, and a third metal level directly overlying said second metal level, said method comprising the steps of:
forming contacts to said first metal level over selected circuit elements where necessary to provide power to the circuit elements;
forming discontinuous power antenna segments at first locations in said first metal level, said power antenna segments for connecting to said contacts., said first location for each power antenna segment corresponding to a particular contact;
forming first vias to said second metal level;
forming discontinuous power bridge segments at second locations in said second metal level for connecting to said power antenna segments by means of said first vias, said second location for each power bridge segment corresponding to a particular power antenna segment;
forming second vias to said third metal level; and
forming power buses in said third metal level for connecting to said power bridge segments by means of said second vias.

* * * * *